United States Patent [19]

Chan et al.

[11] Patent Number: 4,529,894
[45] Date of Patent: Jul. 16, 1985

[54] MEANS FOR ENHANCING LOGIC CIRCUIT PERFORMANCE

[75] Inventors: Yuen H. Chan, Wappingers Falls; James E. Dickerson; Walter S. Klara, both of Hopewell Junction; Theodore W. Kwap, Brewster; Joseph M. Mosley, Hopewell Junction, all of N.Y.

[73] Assignee: IBM Corporation, Hopewell Junction, N.Y.

[21] Appl. No.: 273,706

[22] Filed: Jun. 15, 1981

[51] Int. Cl.$^3$ .................. H03K 19/01; H03K 19/082; H03K 17/04
[52] U.S. Cl. .................................. 307/454; 307/443; 307/455; 307/458; 307/254
[58] Field of Search .............. 307/454, 455, 456, 457, 307/458, 466, 467, 443, 263, 268, 270

[56] References Cited

U.S. PATENT DOCUMENTS

| Re. 27,804 | 10/1973 | Treadway | 307/456 |
|---|---|---|---|
| 2,964,652 | 12/1960 | Yourke | 307/455 |
| 3,358,154 | 12/1967 | Hung | 307/457 |
| 3,505,535 | 4/1970 | Cavaliere | 307/455 |
| 3,518,449 | 6/1970 | Chung | 307/454 |
| 3,549,899 | 12/1970 | Beelitz | 307/455 |
| 3,564,281 | 2/1971 | Tokunaga et al. | 307/254 X |
| 3,699,355 | 10/1972 | Madrazo et al. | 307/254 X |
| 3,769,524 | 10/1973 | Mathews | 307/458 X |
| 3,914,628 | 10/1975 | Pao et al. | 307/270 |
| 4,112,314 | 9/1978 | Gani et al. | 307/458 X |

FOREIGN PATENT DOCUMENTS 2634093 2/1978 Fed. Rep. of Germany .

OTHER PUBLICATIONS

Cirovic, "Basic Electronics: Devices, Circuits, and Systems", Reston Publishing Co., pp. 71-72, 1974.
Perris, Jr. et al., "High Performance Bipolar P-MOS Logic Switching Circuit", IBM Tech. Disl. Bull., vol. 20, No. 1, pp. 184-185, Jun. 1977.

Primary Examiner—Larry N. Anagnos
Assistant Examiner—David R. Bertelson
Attorney, Agent, or Firm—John F. Ohlandt

[57] ABSTRACT

Disclosed is a means for enhancing logic circuit performance and more particularly, for enhancing the switching speeds of a variety of logic circuits. What is involved is the insertion of a so called "snap" or enhancement transistor connected to a common node defining an output of a basic logic circuit. In one example, the emitter of this "snap" transistor is connected to an output node in the circuit, which in conventional practice would be charged during an upgoing transition by a fixed RC time constant. In accordance with the present improvement, however, the "snap" transistor, due to charge stored therein, remains conducting—although the associated logic device is turned off. This current discharges as reverse base current and the output provides what appears to be an inductive voltage spike. The effect is that a temporary source of current is available to charge the common node. As a result, the transition time involved in going from one voltage level to another at the output node is substantially reduced.

9 Claims, 4 Drawing Figures

MEANS FOR ENHANCING LOGIC CIRCUIT PERFORMANCE

BACKGROUND OF THE INVENTION

1. Field of the Invention

This invention relates to logic circuits and more particularly to an arrangement for enhancing or accelerating the switching operation in a variety of well known logic circuits.

2. Background Information

In order to provide background for an appreciation of the present invention, and particularly for an understanding of the several contexts which form the setting for the invention, reference may be made to the following U.S. Pat. Nos. 3,358,154, 3,505,535, 3,549,899, 3,564,281, 3,699,355 and 3,914,628.

Of particular interest with respect to the present invention are two of the aforesaid patents, namely U.S. Pat. Nos. 3,505,535 and 3,358,154. The former is of special note because it relates to an improvement on a particular form of high speed logic circuitry, known in the art as current switching. This technique can be appreciated by reference to U.S. Pat. No. 2,964,652 to H. S. Yourke, the disclosed circuit of which possesses superiority with respect to most other switching circuits, particularly in respect to both speed and stability. In this so-called current switch, a constant current is supplied and is switched either through one or more logic transistors or through a grounded base (reference) transistor, depending upon the potential levels of the input signals at the bases of the logic or signal transistors relative to the reference potential at the grounded base. Since the current which flows through the collector load resistors is substantially constant and predetermined, the circuit parameters may be selected so as to limit the potential swing of the collectors and thereby maintain the transistors out of saturation so as to enhance the switching speed.

The improvement provided by U.S. Pat. No. 3,505,535 on the current switch mode of operation involves the inclusion of a non-linear network at the output of the logic or signal transistors, this network including a load transistor which essentially supplies the non-linear impedance required. The operation of the improved circuit of U.S. Pat. No. 3,505,535 is such that when a logic transistor turns on, the input impedance of the load transistor, unlike a conventional linear load resistor, is reduced to an extremely low value, although providing an extremely high impedance under cut-off conditions.

Whatever the merits of the improved circuit of U.S. Pat. No. 3,505,535 it will become apparent hereinafter that its superficially similar construction totally differs from that of the present invention.

Another pertinent reference, already cited above, is U.S. Pat. No. 3,358,154 which discloses an arrangement for high speed logic gates in which a "tri-state" or three state configuration is provided in its FIG. 2. This circuit also bears a resemblance to the circuit configuration of applicant's invention; however, its operation is fundamentally different in that any improvement in switching speed is gained at the expense of power; moreover the nature of the circuit in U.S. Pat. No. 3,358,154 is such that what may be considered an enhancement transistor operates in an entirely different mode. Thus, that particular enhancement transistor is required to operate in the opposite state from the logic or signal transistors, and during any transient is always being turned off when the signal or logic transistors are being turned on, or vice versa.

It is therefore a primary object of the present invention to provide a means for enhancing logic circuit performance and, more particularly, to enhance the operating speed of a variety of logic circuits.

A more specific object is to enhance the switching speed of a logic circuit by capitalizing on the delay or lag time involved in the switching of an enhancement device connected to a node common to the logic circuit and the associated enhancement device.

The achievement of switching speed enhancement lies in the recognition that the coupling of an enhancement transistor to the output of a high speed logic device can be so arranged that the discharge of current from the enhancement transistor, or equivalent device, can be judiciously exploited during the transition period of the output signal.

SUMMARY OF THE INVENTION

The above and other objects are fulfilled by a broad feature of the present invention which resides in a logic circuit with enhanced switching speed, comprising at least one signal or logic device and with the provision of a speed enhancement transistor connected to a node which is common to both devices; the speed enhancement transistor is so arranged that it becomes capable, during the transition period of the logic output signal, of discharging current so as effectively to "pull up" the output voltage; in other words, of accelerating the transient slope of the output signal. In the exemplary embodiments, the enhancement transistor accelerates the upgoing voltage transition for the common node, whether that be the leading edge or trailing edge of a particular logic waveform.

Accordingly, it will be understood that the speed enhancement transistor functions as a charge storage means, its operation being such as to conduct current while the associated logic or signal device is conducting; moreover, it continues to conduct after the logic device is turned off so as to result in the aforenoted acceleration in the transient slope. The rise time of the output waveform is substantially shortened by reason of this enhancement transistor.

A more specific feature of the enhancement arrangement resides in the particular connection of a base resistor to the enhancement transistor. This base resistor is independently connected from the base of the enhancement transistor to a potential source. Additionally, it is preferred that a collector resistor be connected from the collector of the enhancement transistor to the same potential source. In order to furnish current to the logic transistor under steady state conditions, yet another resistor is connected across the enhancement transistor, that is to say, from the emitter thereof to the said potential source. It will be understood as the description proceeds that this "shunt" resistor functions in the manner of the ordinary load resistor in the output of the logic transistor of a basic switching circuit previously described.

Yet another specific feature relates to the arrangement whereby the charge stored in the speed enhancement transistor is discharged by way of reverse base current flow from the base of said enhancement transistor through the aforenoted base resistor and thence to the potential source, which typically is ground.

Another specific feature resides in the provision whereby the ratio for the enhancement transistor of emitter current $I_E$ to load current is greater than one. This is provided by reason of the selection of the several resistors as will be explained fully hereinafter. In particular, circuit performance of the present invention improves when the load resistor is increased, because then, more current flows through the enhancement transistor and the "snap" action improves.

A further feature involves the selection of the enhancement transistor to have a slower speed than the logic device or devices, whereby it is assured that sufficient charge storage can be effectuated, such that a particular required speed enhancement can be realized.

Other and further objects, advantages and features of the present invention will be understood by reference to the following specification in conjunction with the annexed drawing, wherein like parts have been given like numbers.

DESCRIPTION OF PREFERRED EMBODIMENTS

The form or type of logic circuit known as the current switch mode may be appreciated as indicated above; namely, the reference to U.S. Pat. No. 3,505,535. The improvement described therein occurs in the same basic context as for this first embodiment (FIG. 1) of the present invention.

Figure 1:
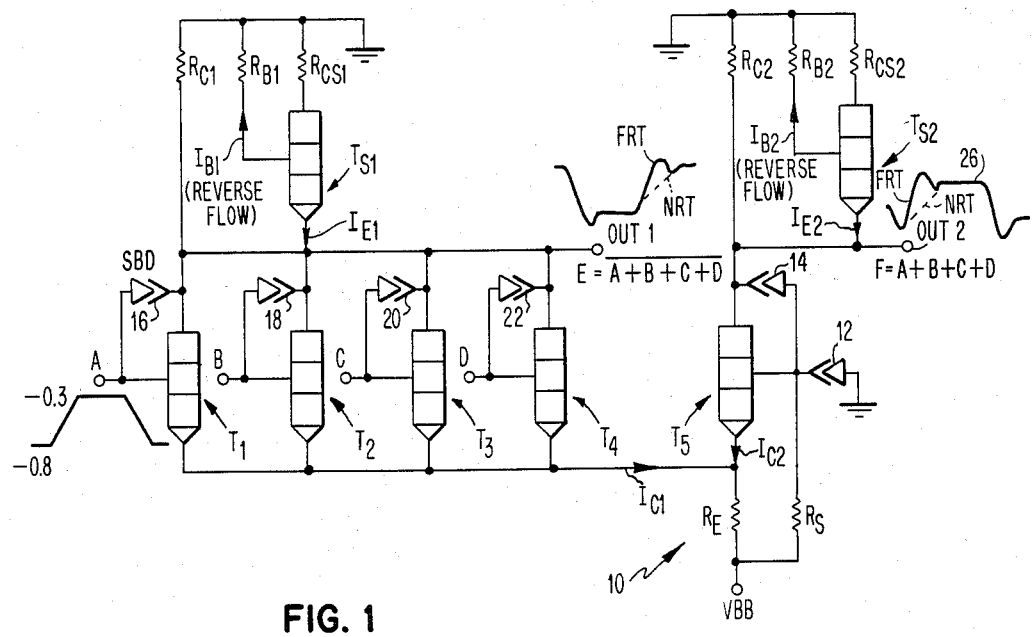
FIG. 1 is a first embodiment of a logic or switching circuit which incorporates the present invention, this type of switching circuit being known as the current switch mode.

It will be seen in FIG. 1 that there is provided a current source 10, comprising the potential source $V_{BB}$ and the resistor $R_E$, which either supplies a substantially constant current to any one or more of the logic or signal transistors $T_1$, $T_2$, $T_3$ and $T_4$; or alternately, supplies such constant current to a reference transistor $T_5$, the base of which is connected by way of a Schottky barrier diode 12 to ground. Schottky barrier diode 14 serves as a clamp to prevent saturation of $T_5$, being connected to $V_{BB}$ through a resistor $R_s$; similar diodes 16, 18, 20, and 22 function for the same purpose in connection with transistors $T_1$, $T_2$, $T_3$, and $T_4$. The circuit of FIG. 1 has the following typical resistor values:

$R_s$ = 4K ohms;
$R_{C1} = R_{C2} = R_{B1} = R_{B2}$ = 4K ohms;
$R_{CS1} = R_{CS2}$ = 150 ohms;
$R_E$ = 200 ohms; and
$V_{BB}$ = −1.8 v.

The current switching circuit, per se, of FIG. 1 provides a "NOR" function. However, the unique aspect of the present invention is that the current switch circuit is modified by the presence of a "snap" transistor and the stored charge properties of this "snap" transistor are utilized to obtain very fast switching speeds. The circuit operates as follows:

With a "down" voltage level applied to the base inputs of transistors $T_1$-$T_4$, the constant current from source 10 flows through transistor $T_5$ with the result that a steady state current $I_{C2}$ flows substantially through register $R_{C2}$. Consequently, the output at OUT2 (in-phase output), which provides the logic function F=A+B+C+D, is at the "down" voltage level when the inputs ABCD are at a corresponding "down" voltage level. Typically, as seen in FIG. 1, this "down" voltage level is −0.8 volts, whereas the "up" level is −0.3 volts.

Now in operation, when a logic input in the form of an "up" level is present at any one of the ABC or D inputs, for example when a "one" is present at the A input, the transistor $T_1$ is turned on. In accordance with the well known current switch mode operation, $T_5$ is correspondingly turned off. The current flowing through $T_1$ overdrives the enhancement or "snap" transistor $T_{S1}$; thus, $T_{S1}$ is turned on so as to provide a hard turn-off, that is, a negative transition to the stage being driven by the output of OUT1. The logic function at this output is $E = \overline{A+B+C+D}$.

Although transistor $T_5$ is turned off, $T_{S2}$, which is the complementary enhancement or "snap" transistor in the other side of the circuit is not yet turned off; i.e. it remains conducting due to the stored charge in this device. This current (reverse base current $I_{B2}$) discharges through $R_{B2}$ and the output, as seen, results in what appears to be a voltage spike in the waveform 26 at OUT 2. The improvement in transition or "rise" time can be appreciated from the dotted showing of normal rise time (NRT), compared with the fast rise time (FRT) achieved.

When input A is ramped to a "down" level of approximately −0.8 volts, $T_1$ is turned off and $T_5$ is turned on. A similar procedure occurs whereby $T_{S2}$ is overdriven and $T_{S1}$ discharges through $R_{B1}$.

Steady state currents through $R_{C1}$ and $R_{C2}$ maintain the "up" levels at the output nodes to drive the respective following stages in the steady state condition. Resistors $R_{B1}$ and $R_{CS1}$ act as an active integrator to enhance the voltage spikes seen at the out-of-phase output (OUT1), while resistors $R_{B2}$ and $R_{CS2}$ perform the same function for the in-phase output (OUT2).

Figure 2:
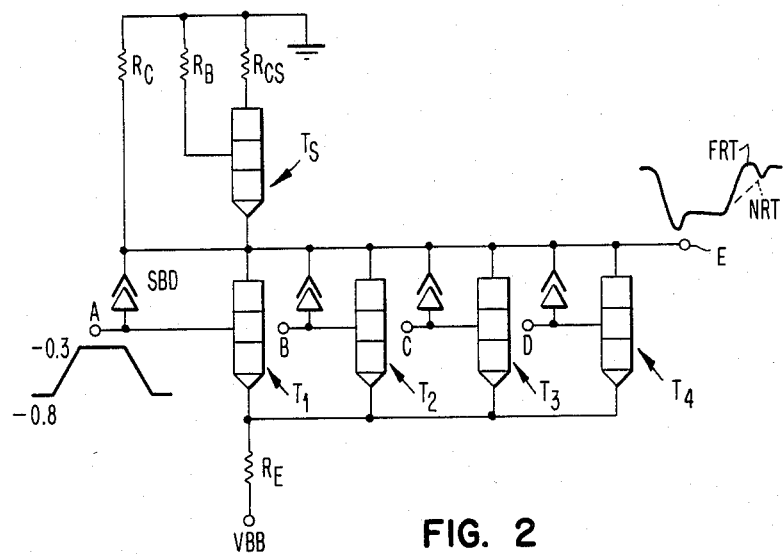
FIG. 2 is another embodiment of a logic circuit in which the present invention may be incorporated. This type or version is known as emitter coupled logic and is related to the FIG. 1 current switch logic.

Referring now to FIG. 2, there is illustrated another form or embodiment of a logic circuit in accordance with the present invention. This circuit of FIG. 2 is a high speed "NOR" logic circuit which is very similar to the out-of-phase portion of the current switch circuit previously seen in FIG. 1. Typical resistor values for this circuit are as follows:

| | |
|---|---|
| SBD approximately | .56 at 100 μa; |
| $R_C$ approximately | 4K |
| $R_B$ approximately | 4K |
| $R_{CS}$ approximately | 0.150K |
| $R_E$ approximately | 0.050K |
| and $V_{BB}$ is approximately | −1.4 volts. |

The operation of the circuit of FIG. 2 is such that when the input at A is raised to approximately −0.3 volts, transistor $T_1$ is turned on. Resistor $R_E$ limits the amount of current, which is supplied at this time mostly through the forward biased diode of transistor $T_S$, referred to previously as the enhancement or "snap" transistor. Sufficient current through $T_S$ is required to put stored charge in the base of $T_S$. As before in the circuit of FIG. 1, the logic transistors $T_1$-$T_4$ are kept out of saturation by the respective Schottky barrier diodes connected across their collector-base junctions. Since the output at E is inverted or out-of-phase with the input signal applied at input A, its voltage is approximately $-0.8$ as will be seen from the pulse form immediately adjacent output E.

Now, however, when the input at A is lowered to $-0.8$ volts, transistor $T_1$ is turned off. As already explained in connection with FIG. 1, the enhancement or "snap" transistor $T_S$ remains conducting due to stored charge therein. This current discharges out through base resistor $R_B$, and the output as seen has an "up" transition with what appears to be an inductive voltage spike, thereby switching the stage being driven very hard. Once the stored charge is removed from $T_S$, the stage being driven is kept on by the current supplied through $R_C$, the load resistor. The resistor $R_{CS}$ connected to the collector of transistor $T_S$ and to ground, and the base resistor $R_B$ likewise connected to ground, act together as an integrator to maintain the voltage at output E at a high, that is, most positive, voltage level until resistor $R_C$ can supply the required DC current. Voltage supply $V_{BB}$ must be carefully chosen to insure turn-off of the following stage.

It will be appreciated from the above description, particularly in connection with FIG. 2, that when $T_1$, $T_2$, $T_3$ and $T_4$ are turned off, the output voltage increases rapidly due to the speed enhancement transistor discharging reverse base current, which rapidly pulls up the output voltage. It will likewise be understood that, when $T_1$, $T_2$, $T_3$ or $T_4$ is turned on, the output voltage falls rapidly as well, due to the fact that the speed enhancement transistor (which is preferably designed to be a slow device) cannot be turned on as rapidly as $T_1$, $T_2$, $T_3$ or $T_4$. Accordingly, the speed enhancement transistor, which does not turn on until the output load has fallen through its threshold voltage, does not appear as a load to the logic transistors. Hence, an overshoot in voltage is obtained on both the rising and falling output transitions.

Figure 3:
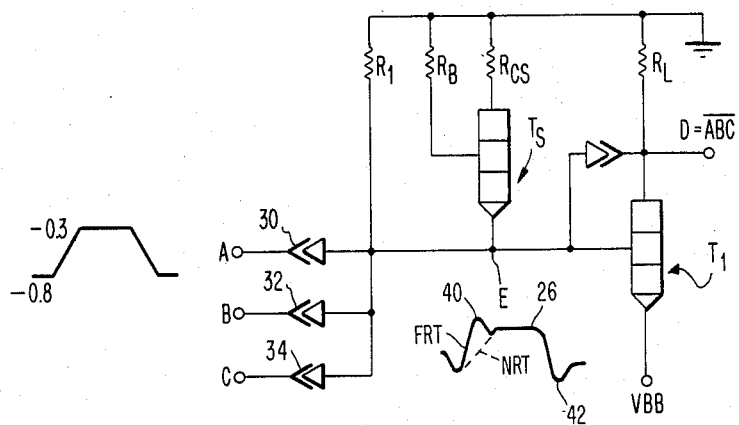
FIG. 3 is yet another embodiment of a logic circuit configuration or context, known as D²L, in which the present invention may be operated.

Turning now to FIG. 3, yet another embodiment of the logic circuit of the present invention is provided in another context. That is to say, in the context of a $D^2L$ circuit. Again, the objective is to increase circuit performance of the $D^2L$ circuit by utilizing the stored charge properties of an enhancement transistor. The circuit of FIG. 3 functions as follows:

An inverted output at "D" only occurs when all inputs, that is, inputs at A, B, and C, are at a positive or "one" level. If any or all inputs are at a down level (approximately $-0.8$ volts) current will flow through $R_1$ and through the enhancement transistor $T_S$, as well as through the Schottky barrier diodes 30, 32, and 34, forming the input logic gate; and finally, current will flow through the transistor $T_1$ of the driving stage.

A positive going transition at all of the inputs to an up level of approximately $-0.3$ volts will operate to cut off current in the Schottky barrier diodes 30, 32, and 34. However, current in transistor $T_S$ remains conducting due to stored charge in this device. This current discharges out through the base of $T_S$ and produces a voltage spike 40 as seen at the common node E and therefore at the base of transistor $T_1$, thereby turning the $T_1$ output transistor on very hard, so as to produce very brief transition times. When any of the inputs is brought down, negative overdrive, such as can be seen at 42 occurs at the base of $T_1$ due to the slow response of the enhancement transistor $T_S$.

Figure 4:
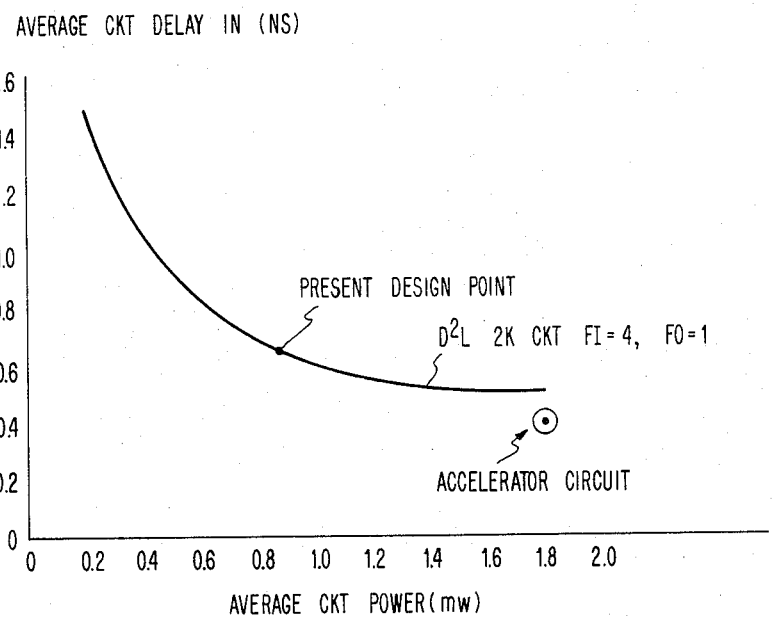
FIG. 4 is a graph illustrating a speed-power curve for a D²L circuit, and comparing a present design point thereon with a design point in accordance with the present invention.

FIG. 4 shows a speed-power curve of a $D^2L$ circuit with a conventional design point. This curve shows that the performance of the $D^2L$ circuit bottoms out at around 500 picoseconds regardless of any further increase in power. However, by doubling the power and using the enhancement circuit, that is to say, a conventional $D^2L$ circuit, but with the enhancement transistor incorporated as already described, a speed of 400 picoseconds is obtained or an improvement in performance of 38%.

The advantages of the enhancement or accelerator circuit of the present invention reside in this approximately 38% improvement in circuit performance when compared with 22% for a conventional $D^2L$ circuit whose power is doubled. Moreover, nominal delays of 400 picoseconds are obtained, as well as a better speed-power product than conventional $D^2L$ circuits. The logic circuit arrangement of the present invention is clearly extendible to faster speeds at higher power levels.

While there has been shown and described what are considered at present to be the preferred embodiments of the present invention, it will be appreciated by those skilled in the art that modifications of such embodiments may be made. It is therefore desired that the invention not be limited to these embodiments, and it is intended to cover in the appended claims all such modifications as fall within the true spirit and scope of the invention.

What is claimed is:

1. A logic circuit, having an input terminal and an output terminal, for providing enhanced logic or switching speed comprising:
   at least one logic device, having at least two electrodes, one of which is connected to the logic circuit input terminal, the other being connected to the logic circuit output terminal;
   a speed enhancement switching transistor having emitter, base, and collector regions;
   further including a common and direct connection between said emitter region of said speed enhancement switching transistor and the other of said two electrodes, said common and direct connection also being made to said output terminal;
   a source of potential operatively coupled to the collector path of said speed enhancement switching transistor;
   the speed enhancement switching transistor functioning to store charge, and including means, having substantial impedance, connected between the base region of said speed enhancement switching transistor and said source of potential, for discharging current during the transition period of the output signal so as effectively to pull up the output terminal voltage, thereby accelerating the transient slope of the output signal.

2. A logic circuit as defined in claim 1, in which both the logic device and the speed enhancement switching transistor are in the ON state together and both are in the OFF state together, the speed enhancement transistor lagging behind the logic device in the transition from one of said states to the other.

3. A logic circuit as defined in claim 1, in which said at least one logic device comprises a transistor having collector, base and emitter regions;

the speed enhancement switching transistor having its emitter region connected directly to the collector region of said at least one logic transistor.

4. A logic circuit as defined in claim 3, in which said speed enhancement switching transistor has a switching speed slower than said at least one logic transistor, whereby it is assured that sufficient charge storage will be affectuated such that a required speed enhancement can be realized.

5. A logic circuit as defined in claim 1, further including means providing the charge stored in the speed enhancement switching transistor is discharged as reverse base current flow.

6. A logic circuit as defined in claim 1, in which said means having substantial impedance comprises a base resistor.

7. A logic circuit as defined in claim 5, in which a resistor is connected from the collector of said speed enhancement switching transistor directly to said source.

8. A logic circuit as defined in claim 6, in which a load resistor is connected from said common and direct connection directly to said source of potential.

9. A logic circuit as defined in claim 8, in which the ratio of emitter current $I_E$ of the speed enhancement switching transistor to current through said load resistor is greater than one.

* * * * *